(12) United States Patent
Xiao et al.

(10) Patent No.: US 12,222,291 B2
(45) Date of Patent: Feb. 11, 2025

(54) MOLECULAR PROBE-BASED SAFETY PREWARNING AND FAULT LOCATION SYSTEM FOR ELECTROCHEMICAL ENERGY STORAGE STATION

(71) Applicants: State Grid Jiangsu Electric Power Co., Ltd. Research Institute, Jiangsu (CN); State Grid Jiangsu Electric Power Co., Ltd., Jiangsu (CN); State Grid Corporation of China, Beijing (CN)

(72) Inventors: Peng Xiao, Jiangsu (CN); Jianjun Liu, Jiangsu (CN); Dongliang Guo, Jiangsu (CN); Liheng Yang, Jiangsu (CN)

(73) Assignees: State Grid Jiangsu Electric Power Co., Ltd. Research Institute, Nanjing (CN); State Grid Jiangsu Electric Power Co., Ltd., Nanjing (CN); State Grid Corporation of China, Beijing (CN)

( * ) Notice: Subject to any disclaimer, the term of this patent is extended or adjusted under 35 U.S.C. 154(b) by 633 days.

(21) Appl. No.: 17/617,574

(22) PCT Filed: Aug. 10, 2021

(86) PCT No.: PCT/CN2021/111915
§ 371 (c)(1),
(2) Date: Dec. 8, 2021

(87) PCT Pub. No.: WO2022/037448
PCT Pub. Date: Feb. 24, 2022

(65) Prior Publication Data
US 2022/0307985 A1    Sep. 29, 2022

(30) Foreign Application Priority Data
Aug. 17, 2020   (CN) .......................... 202010824630.6

(51) Int. Cl.
*G01N 21/78*  (2006.01)
*G01R 31/36*  (2020.01)

(52) U.S. Cl.
CPC .......... *G01N 21/783* (2013.01); *G01R 31/36* (2013.01)

(58) Field of Classification Search
CPC .............................. G01N 21/783; G01R 31/36
(Continued)

(56) References Cited

U.S. PATENT DOCUMENTS

| 9,553,465 B2 * | 1/2017 | Raghavan ............ G01R 31/382 |
| 10,352,777 B2 * | 7/2019 | Georgeson .......... H01M 10/488 |

(Continued)

FOREIGN PATENT DOCUMENTS

| CN | 207816480 U | 9/2018 |
| CN | 108682283 A | 10/2018 |

(Continued)

*Primary Examiner* — Zhen Y Wu

(57) ABSTRACT

A molecular probe-based safety prewarning and fault location system for an electrochemical energy storage station includes a molecular probe label, a camera, and a host. The present disclosure realizes real-time safety prewarning of a fault of an electrochemical energy storage device based on a color change of a gas sensing region of the molecular probe label, and locates an abnormal electrochemical energy storage device based on a position marker region of the molecular probe label or a position of the camera on a slide rail when the camera is facing the molecular probe label. Operation and maintenance personnel of an energy storage station can obtain a prewarning signal in time and take a corresponding safety measure. The molecular probe technology is a drive-free technology with advantages of high sensitivity, low costs, and anti-interference. It has important application value for operation safety of a large-scale energy storage station.

19 Claims, 1 Drawing Sheet

(58) Field of Classification Search
USPC .......................................................... 340/632
See application file for complete search history.

(56) References Cited

U.S. PATENT DOCUMENTS

| | | | | |
|---|---|---|---|---|
| 10,801,900 | B2* | 10/2020 | Poirier | G01K 11/12 |
| 2014/0370344 | A1* | 12/2014 | Lovelace | H02J 7/0069 |
| | | | | 429/185 |
| 2015/0132620 | A1* | 5/2015 | Sahner | H01M 10/4228 |
| | | | | 429/90 |
| 2016/0011270 | A1* | 1/2016 | Poirier | G01K 11/12 |
| | | | | 324/426 |
| 2016/0025812 | A1* | 1/2016 | Bourilkov | G01R 19/16576 |
| | | | | 324/435 |
| 2016/0195437 | A1* | 7/2016 | Georgeson | G01K 11/125 |
| | | | | 374/162 |
| 2017/0116663 | A1* | 4/2017 | Francis | G06Q 10/087 |
| 2020/0021742 | A1* | 1/2020 | Deng | G06V 20/52 |

FOREIGN PATENT DOCUMENTS

| | | |
|---|---|---|
| CN | 110659710 A | 1/2020 |
| CN | 110783650 A | 2/2020 |

\* cited by examiner

MOLECULAR PROBE-BASED SAFETY PREWARNING AND FAULT LOCATION SYSTEM FOR ELECTROCHEMICAL ENERGY STORAGE STATION

TECHNICAL FIELD

The present disclosure relates to the technical field of safety monitoring, and specifically, to a molecular probe-based safety prewarning and fault location system for an electrochemical energy storage station.

BACKGROUND

With the increasing depletion of oil, coal, and natural gas, the third energy revolution from non-renewable energy sources to renewable energy sources emerges. However, affected by seasons, weather, regions, and other conditions, the renewable energy sources such as solar energy, wind energy, and ocean energy have obvious fluctuation, discontinuity, and poor adjustability. Therefore, electric energy generated by the renewable energy sources cannot be directly connected to a power grid or used by users. A large-scale and efficient energy storage system can well suppress instability of power generation by using new energy sources. As a key technology to support the development and popularization of the renewable energy sources, the large-scale and efficient energy storage system also plays an important role in developing an electric power system and performing energy transformation. "New energy source+energy storage" is considered to be an ultimate form of obtaining and utilizing an energy source in the future.

Electrochemical energy storage technologies represented by lithium-ion batteries have a high energy density and a long cycle life, and are environmentally friendly, and therefore, become main application technologies of the large-scale energy storage system. At present, most energy storage stations based on an electrochemical battery technology such as a lithium-ion battery adopt a prefabricated cabin. To be specific, multiple batteries are connected in series and in parallel to form a battery module, multiple battery modules are connected in series and in parallel to form a battery cluster, and multiple battery clusters are disposed in the prefabricated cabin after being connected in series and in parallel. Generally, there are tens of thousands of batteries in one prefabricated cabin. However, due to technologies and other reasons, electrochemical parameters such as a capacity, an internal resistance, and an open-circuit voltage are different for the batteries. Long-time integrated operation, especially a high-rate and high-frequency charge-discharge cycle, further worsens battery inconsistency, thereby causing a thermal runaway reaction inside the batteries. Therefore, real-time monitoring of a battery status is of great significance to operation safety of the large-scale energy storage system.

Safety monitoring of the existing energy storage station mainly depends on smoke and temperature sensors installed on the top of the prefabricated cabin and thermocouples scattered in the battery module. The smoke and temperature sensors are relatively expensive. Therefore, considering construction costs, a limited number of sensors are installed in one prefabricated cabin, resulting in a certain spatial separation between the sensor and the battery module. As a result, the sensor cannot perceive a battery fault quickly. When thermal runaway reaches a certain stage, a lot of smoke and heat are released before they can be detected by the sensor. In addition, most of these sensors are electrochemical, and induced currents generated by these sensors are easy to be disturbed by electromagnetic waves in the cabin, resulting a false alarm. Moreover, although the thermocouple has high temperature measurement accuracy, its detection area is limited. In addition, the thermocouple needs to be driven by external electric energy, and also needs to be connected to a control module by using a line. Therefore, simply increasing a layout density of the thermocouple will increase electrical complexity in the battery module and affect heat dissipation of the battery during operation. Therefore, existing monitoring facilities cannot realize timely, stable, and reliable safety prewarning for the large-scale energy storage system.

SUMMARY

To overcome the shortcomings in the prior art, the present disclosure provides a molecular probe-based safety prewarning and fault location system for an electrochemical energy storage station, to resolve a problem that an existing safety monitoring system of an electrochemical energy storage station cannot perceive and locate an abnormal electrochemical energy storage device in time. In this way, operation and maintenance personnel of the energy storage station can obtain a prewarning signal and a position of the abnormal electrochemical energy storage device in time, and take a corresponding safety measure to avoid a large loss caused by untimely discovery of a dangerous situation, and improve operation safety of the energy storage station.

To overcome the shortcomings in the prior art, the present disclosure provides the following technical solution:

The present disclosure provides a molecular probe-based safety prewarning and fault location system for an electrochemical energy storage station, including a molecular probe label, a camera, and a host, where there are a plurality of molecular probe labels distributed in an electrochemical energy storage device group, and the molecular probe label is provided with a gas sensing region that can perform a specific reaction with a gas and generate a color change;

the camera is configured to capture real-time image information of each molecular probe label and transmit the real-time image information to the host; and the host is configured to recognize an abnormal electrochemical energy storage device based on the real-time image information of the gas sensing region of the molecular probe label, and configured to recognize position information of the abnormal electrochemical energy storage device, and output an alarm signal and the position information of the abnormal electrochemical energy storage device.

Preferably, the gas sensing region is provided with at least one specific reaction region, a surface of each specific reaction region is coated with a functional molecule that can perform a specific reaction with one or more of carbon monoxide, nitric oxide, and hydrogen sulfide and generate a color change, and it needs to take one second to 30 minutes to generate the color change in the specific reaction.

Preferably, the molecular probe label is further provided with a position marker region for recording position information of an electrochemical energy storage device; and the host recognizes a position of the abnormal electrochemical energy storage device based on an image of the position marker region.

Preferably, the position information, of the electrochemical energy storage device, recorded in the position marker region includes a number of a specific prefabricated cabin of the electrochemical energy storage device in an energy storage station, a number of the electrochemical energy storage device group, and a number of the electrochemical energy storage device; and the position information is printed in the position marker region in a form of Chinese, English, a one-dimensional code, a two-dimensional code, or a digital number.

Preferably, the camera is secured on an inner wall of a prefabricated cabin.

Preferably, the camera is securely installed on a slide rail in a prefabricated cabin.

Preferably, the host is further configured to:
recognize the position information of the abnormal electrochemical energy storage device based on a position of the camera on the slide rail when the camera is facing the molecular probe label.

Preferably, the camera is a visible light camera or a fluorescent camera, and the camera transmits the real-time image information of each molecular probe label to the host through wired communication or wireless communication.

Preferably, the host is specifically configured to:
calculate a color change value of a surface of the gas sensing region of the molecular probe label by using one or more of an RGB color system, a YUV color system, and an HLS color system based on the real-time image information of the gas sensing region of the molecular probe label;
compare the color change value with a preset threshold, and recognize a molecular probe label whose color change value exceeds the preset threshold; and
determine, as the abnormal electrochemical energy storage device, an electrochemical energy storage device in a region in which the molecular probe label whose color change value exceeds the preset threshold is located.

Preferably, the electrochemical energy storage device group is constituted by electrochemical energy storage devices using an organic electrolyte.

Preferably, the electrochemical energy storage device group includes:
a battery cluster or battery pack composed of one or more of metal ion batteries such as a lithium-ion battery, a sodium-ion battery, an aluminum-ion battery, a potassium-ion battery, and a magnesium-ion battery; or
a supercapacitor bank composed of one or two of metal-ion hybrid supercapacitors such as a lithium-ion hybrid supercapacitor and a potassium-ion hybrid supercapacitor.

Beneficial Effects of the Present Disclosure

The molecular probe-based safety prewarning and fault location system for an electrochemical energy storage station in the present disclosure realizes real-time safety prewarning of the abnormal electrochemical energy storage device based on the color change of the gas sensing region of the molecular probe label, and accurately locates the abnormal electrochemical energy storage device based on the position marker region of the molecular probe label or the position of the camera on the slide rail when the camera is facing the molecular probe label. In this way, operation and maintenance personnel of an energy storage station can obtain a prewarning signal in time and take a corresponding safety measure. The molecular probe technology is a drive-free technology with advantages of high sensitivity, low costs, and anti-interference. It has important application value for operation safety of a large-scale energy storage station.

DETAILED DESCRIPTION

The present disclosure is further described below in combination with specific implementations. The following implementations are only used for describing the technical solutions of the present disclosure more clearly, and are not intended to limit the protection scope of the present disclosure.

The present disclosure provides a molecular probe-based safety prewarning and fault location system for an electrochemical energy storage station, including a molecular probe label 2, a camera 3, and a host 4.

Figure 1:
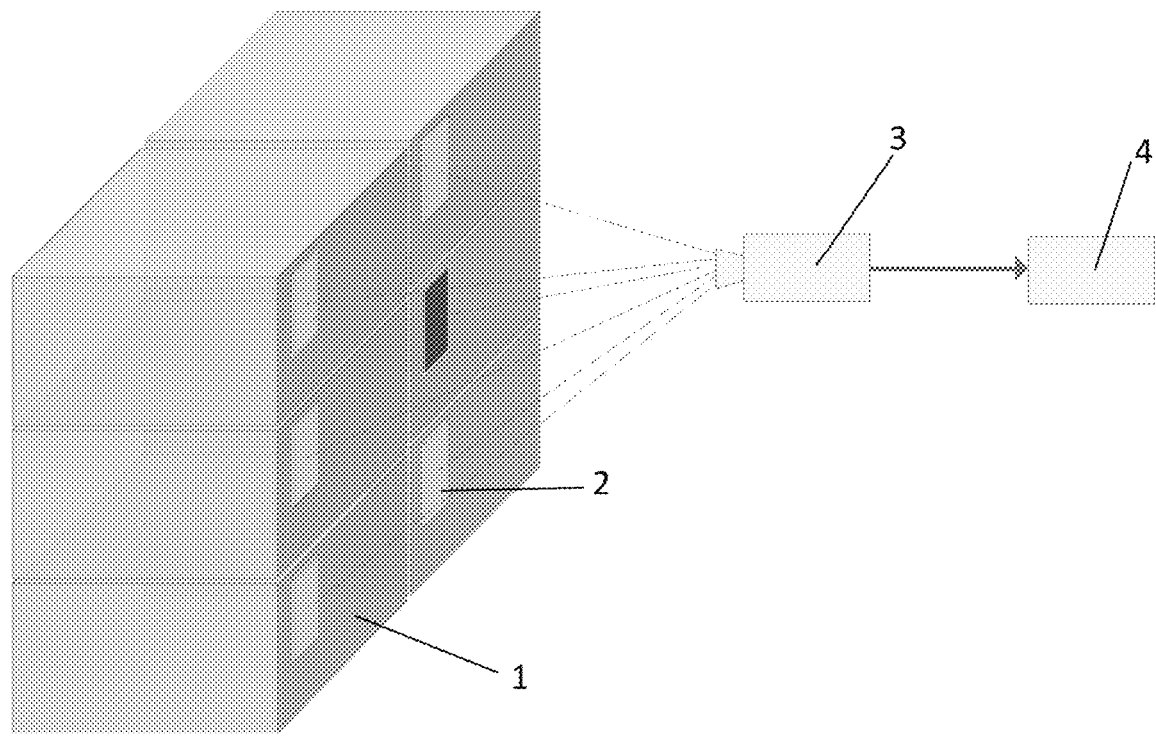
FIG. 1 is a structural diagram of a molecular probe-based safety prewarning and fault location system for an electrochemical energy storage station according to the present disclosure.
Figure 2:
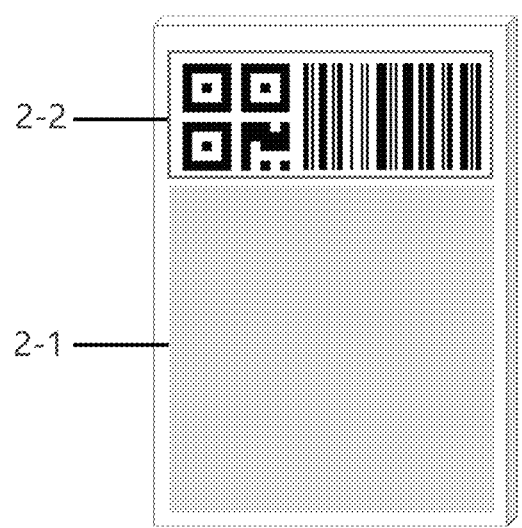
FIG. 2 is a structural diagram of a molecular probe label according to the present disclosure.

As shown in FIG. 1, the molecular probe label 2 is disposed in an electrochemical energy storage device group 1. A layout density of the molecular probe label 2 can be adjusted based on required fault location accuracy. The molecular probe label 2 may be disposed in each electrochemical energy storage device group 1 or on each electrochemical energy storage device. As shown in FIG. 2, the molecular probe label 2 is provided with a gas sensing region 2-1 that can perform a specific reaction with a gas and generate a color change. The gas sensing region 2-1 is provided with at least one specific reaction region, and a surface of the specific reaction region is coated with a functional molecule that can perform a specific reaction with one or more of carbon monoxide, nitric oxide, and hydrogen sulfide and generate a color change. For example, a molecule with an aromatic o-diamine group can perform specific recognition on the nitric oxide, and a ruthenium complex can perform specific recognition on the carbon monoxide. The gas sensing region 2-1 does not need to be driven by external energy. When the gas sensing region 2-1 contacts the carbon monoxide, the nitric oxide, the hydrogen sulfide, and other gases, a color of a surface of the gas sensing region 2-1 changes significantly. Based on compositions of the functional molecule, a same molecular probe label 2 may perform a color change reaction with one of the carbon monoxide, the nitric oxide, the hydrogen sulfide, and other gases, or may perform a color change reaction with two or more of the carbon monoxide, the nitric oxide, the hydrogen sulfide, and other gases at the same time. Alternatively, different specific reaction regions on a same molecular probe label 2 may perform color change reactions with one or more gases respectively. In practical use, because there are many types of functional molecules, different color change reactions occur in the gas sensing region 2-1 for a same gas. A specific color change of the gas sensing region 2-1 depends on a type of the functional molecule. Based on the compositions of the functional molecule, it needs to take one second to 30 minutes to generate the color change in the specific reaction. A rate and a degree of the color change are related to concentrations of the carbon monoxide, the nitric oxide, the hydrogen sulfide, and other gases contacted by the functional molecule. The molecular probe label 2 is further provided with a position marker region 2-2 for recording position information of the electrochemical energy storage device, and the position information may be printed on a surface of the molecular probe label 2 in a form of Chinese, English, a one-dimensional code, a two-dimensional code, or a digital number. The position information of the electrochemical energy storage device specifically includes a number of a specific prefabricated cabin of the abnormal electrochemical energy storage device in an energy storage station, a number of the electrochemical energy storage device group, a number of the electrochemical energy storage device, and other information.

The camera 3 is installed in a prefabricated cabin and transmits real-time image information of each molecular probe label 2 to the host 4. Specifically, the camera 3 may be an ordinary visible light camera or a fluorescent camera, depending on a configuration of the functional molecule coated on the surface of the gas sensing region 2-1. The camera 3 may be secured on a side wall or a top wall inside the prefabricated cabin or on a slide rail in the prefabricated cabin. One or more cameras 3 may be installed as required to ensure that the real-time image information of each molecular probe label 2 can be captured. The camera 3 transmits the real-time image information of each molecular probe label 2 to the host 4 through wired communication or wireless communication.

The host 4 recognizes an abnormal electrochemical energy storage device based on the real-time image information of the gas sensing region 2-1 of the molecular probe label 2. The host 4 recognizes a position of the abnormal electrochemical energy storage, and outputs an alarm signal and position information of the abnormal electrochemical energy storage device. Specifically, the host 4 calculates a color change value of the surface of the gas sensing region 2-1 of the molecular probe label 2 by using one or more of an RGB color system, a YUV color system, and an HLS color system based on the real-time image information of the gas sensing region 2-1 of the molecular probe label 2; compares the color change value with a preset threshold, and recognizes a molecular probe label 2 whose color change value exceeds the preset threshold; and determines, as the abnormal electrochemical energy storage device, an electrochemical energy storage device in a region in which the molecular probe label 2 whose color change value exceeds the preset threshold is located. The host 4 may recognize the position information of the abnormal electrochemical energy storage device based on the position marker region 2-2 of the molecular probe label 2, or may recognize the position information of the abnormal electrochemical energy storage device based on a position of the camera 3 on the slide rail when the camera 3 is facing the molecular probe label 2. After the abnormal electrochemical energy storage device is detected, the host 4 releases a safety prewarning signal and the position information of the abnormal electrochemical energy storage device, so that operation and maintenance personnel can obtain the prewarning signal and the position of the abnormal electrochemical energy storage device in time, and take a corresponding safety measure for the abnormal electrochemical energy storage device.

The electrochemical energy storage device group 1 applicable to the present disclosure is constituted by electrochemical energy storage devices using an organic electrolyte (such as ethylene carbonate or dimethyl carbonate).

Specifically, the electrochemical energy storage device group 1 may be a battery cluster or battery pack composed of one or more of metal ion batteries such as a lithium-ion battery, a sodium-ion battery, an aluminum-ion battery, a potassium-ion battery, and a magnesium-ion battery.

The present disclosure is also applicable to a supercapacitor bank composed of one or two of metal-ion hybrid supercapacitors such as a lithium-ion hybrid supercapacitor and a potassium-ion hybrid supercapacitor.

The working principle of the present disclosure is as follows:

An electrolyte of an organic system is used for most of the commercial lithium-ion battery and sodium-ion battery, metal ion batteries such as the aluminum-ion battery, the potassium-ion battery, and the magnesium-ion battery that may be popularized in the future, as well as metal-ion hybrid supercapacitors such as the lithium-ion hybrid supercapacitor and the potassium-ion hybrid supercapacitor. For example, main electrolytes used in the lithium-ion battery are vinyl carbonate and dimethyl carbonate. When the battery is at an early stage of thermal runaway, the organic electrolyte is decomposed inside the battery to produce gases such as the carbon monoxide, the nitric oxide, and the hydrogen sulfide, and the gases can escape into ambient air before a safety valve of the battery is opened. Therefore, by monitoring characteristic gases such as the carbon monoxide, the nitric oxide, and the hydrogen sulfide in real time, a prewarning signal can be provided in time when the battery is abnormal. According to the present disclosure, distributed characteristic gas monitoring is performed on each electrochemical energy storage device group 1 and even each electrochemical energy storage device in an energy storage system by using the molecular probe label 2, and the abnormal electrochemical energy storage device can be accurately located based on the position marker region 2-2 of the molecular probe label 2 or the position of the camera 3 on the slide rail when the camera 3 is facing the molecular probe label 2. In this way, the specific position of the abnormal electrochemical energy storage device in the energy storage system can be determined based on a release source of the characteristic gas.

Embodiment 1

This embodiment of the present disclosure provides a molecular probe-based safety prewarning and fault location system for an electrochemical energy storage station. As shown in FIG. 1, an electrochemical energy storage device group 1 is composed of six lithium-ion battery modules, and a molecular probe label 2 is pasted on each lithium-ion battery module. A position marker region 2-2 of the molecular probe label 2 uses a two-dimensional code to mark position information of the molecular probe label 2, in other words, mark the six lithium-ion battery modules. A gas sensing region 2-1 of the molecular probe label 2 is provided with a specific reaction region, and a surface of the specific reaction region is coated with a functional molecule ruthenium complex that can generate a specific reaction with carbon monoxide. A wide-angle high-definition camera 3 installed on a top wall of a prefabricated cabin can observe each molecular probe label 2 and transmit real-time image information of the molecular probe label 2 to a host 4 through wired transmission. The host 4 calculates a color change value of a surface of the gas sensing region 2-1 of the molecular probe label 2 by using an RGB color system, in other words, recognizes a color change of the surface of the gas sensing region 2-1 based on value changes of the three primary colors.

When a lithium-ion battery in one of the modules is abnormal, at an initial stage of thermal runaway of the lithium-ion battery, vinyl carbonate in an organic electrolyte is decomposed, and generated carbon monoxide escapes. Therefore, the ruthenium complex coated on the molecular probe label 2 on the module reacts rapidly with the carbon monoxide, and a color of the surface of the gas sensing region 2-1 changes from yellow to blue within 10 seconds. The color change process on the surface of the gas sensing region 2-1 is recognized by the host 4. The host 4 determines that the battery in the module is faulty, reads the two-dimensional code on the position marker region 2-2 of the molecular probe label 2, and obtains, through parsing, that the battery module is in a second row and a second column in an energy storage system. The host 4 releases a prewarning signal and position information of the battery module. Operation and maintenance personnel in a station receive the prewarning signal and the position information, carry out a power-off operation, and restart the energy storage system after replacing the faulty battery module.

Embodiment 2

This embodiment of the present disclosure provides a molecular probe-based safety prewarning and fault location system for an electrochemical energy storage station. An electrochemical energy storage device is composed of six sodium-ion battery modules, and a molecular probe label is pasted on each sodium-ion battery module. The molecular probe label uses a digital code to mark position information. A gas sensing region of the molecular probe label is provided with a specific reaction region, and a surface of the specific reaction region is coated with a functional molecule with an aromatic o-diamine group and capable of performing a specific reaction with nitric oxide. A 40-megapixel wide-angle camera installed on an inner wall of a prefabricated cabin can observe each molecular probe label and transmit real-time image information to a host by using a wireless signal. The host calculates a color change value of a surface of the gas sensing region of the molecular probe label by using an HLS color system, in other words, recognizes a color change of the surface of the gas sensing region based on changes of brightness, color saturation, and hue.

When a sodium-ion battery in one of the modules is abnormal, at an initial stage of thermal runaway of the sodium-ion battery, diethyl carbonate in an organic electrolyte is decomposed, and generated nitric oxide escapes. Therefore, the functional molecule with an aromatic o-diamine group on the molecular probe label on the module reacts rapidly with the nitric oxide, and a color of the gas sensing region changes from green to red within five seconds. The color change process on the surface of the gas sensing region is recognized by the host. The host determines that the sodium-ion battery in the module is faulty, reads a digital code on the molecular probe label, and obtains, through parsing, that the battery module is in a second row and a second column in an energy storage system. The host releases a prewarning signal and position information of the battery module. Operation and maintenance personnel in a station receive the prewarning signal and the position information, carry out a power-off operation, and restart the energy storage system after replacing the faulty battery module.

The molecular probe-based safety prewarning and fault location system for an electrochemical energy storage station in the present disclosure realizes real-time safety prewarning of the abnormal electrochemical energy storage device based on the color change of the gas sensing region of the molecular probe label, and accurately locates the abnormal electrochemical energy storage device based on the position marker region of the molecular probe label or the position of the camera on the slide rail when the camera is facing the molecular probe label. In this way, operation and maintenance personnel of an energy storage station can obtain a prewarning signal in time and take a corresponding safety measure. The molecular probe technology is a drive-free technology with advantages of high sensitivity, low costs, and anti-interference. It has important application value for operation safety of a large-scale energy storage station.

The foregoing descriptions are only preferred implementations of the present disclosure. It should be noted that multiple improvements and modifications may further be made by a person of ordinary skill in the art without departing from the principle of the present disclosure, and such improvements and modifications should also be deemed as falling within the protection scope of the present disclosure.

The invention claimed is:

1. A molecular probe-based safety prewarning and fault location system for an electrochemical energy storage station, comprising a molecular probe label, a camera, and a host, wherein
there are a plurality of molecular probe labels distributed in an electrochemical energy storage device group, and the molecular probe label is provided with a gas sensing region that can perform a specific reaction with a gas and generate a color change;
the camera is configured to capture real-time image information of each molecular probe label and transmit the real-time image information to the host; and
the host is configured to recognize an abnormal electrochemical energy storage device based on the real-time image information of the gas sensing region of the molecular probe label, and configured to recognize position information of the abnormal electrochemical energy storage device, and output an alarm signal and the position information of the abnormal electrochemical energy storage device;
wherein the gas sensing region is provided with at least one specific reaction region, a surface of each specific reaction region is coated with a functional molecule that can perform a specific reaction with carbon monoxide or nitric oxide and generate a color change, and a time needed to generate the color change in the specific reaction is 1 second to 30 minutes.

2. The molecular probe-based safety prewarning and fault location system for an electrochemical energy storage station according to claim 1, wherein the molecular probe label is further provided with a position marker region for recording position information of an electrochemical energy storage device; and the host recognizes the position information of the abnormal electrochemical energy storage device based on an image of the position marker region.

3. The molecular probe-based safety prewarning and fault location system for an electrochemical energy storage station according to claim 2, wherein the position information, of the electrochemical energy storage device, recorded in the position marker region comprises a number of a specific prefabricated cabin of the electrochemical energy storage device in an energy storage station, a number of the electrochemical energy storage device group, and a number of the electrochemical energy storage device; and the position information is printed in the position marker region in a form of Chinese, English, a one-dimensional code, a two-dimensional code, or a digital number.

4. The molecular probe-based safety prewarning and fault location system for an electrochemical energy storage station according to claim 1, wherein the camera is secured on an inner wall of a prefabricated cabin.

5. The molecular probe-based safety prewarning and fault location system for an electrochemical energy storage station according to claim 1, wherein the camera is securely installed on a slide rail in a prefabricated cabin.

6. The molecular probe-based safety prewarning and fault location system for an electrochemical energy storage station according to claim 5, wherein the host is further configured to:
recognize the position information of the abnormal electrochemical energy storage device based on a position of the camera on the slide rail when the camera is facing the molecular probe label.

7. The molecular probe-based safety prewarning and fault location system for an electrochemical energy storage station according to claim 4, wherein the camera is a visible light camera or a fluorescent camera, and the camera transmits the real-time image information of each molecular probe label to the host through wired communication or wireless communication.

8. The molecular probe-based safety prewarning and fault location system for an electrochemical energy storage station according to claim 1, wherein the host is specifically configured to:
calculate a color change value of a surface of the gas sensing region of the molecular probe label by using one or more of an RGB color system, a YUV color system, and an HLS color system based on the real-time image information of the gas sensing region of the molecular probe label;
compare the color change value with a preset threshold, and recognize a molecular probe label whose color change value exceeds the preset threshold; and
determine, as the abnormal electrochemical energy storage device, an electrochemical energy storage device in a region in which the molecular probe label whose color change value exceeds the preset threshold is located.

9. The molecular probe-based safety prewarning and fault location system for an electrochemical energy storage station according to claim 1, wherein the electrochemical energy storage device group is constituted by electrochemical energy storage devices using an organic electrolyte.

10. The molecular probe-based safety prewarning and fault location system for an electrochemical energy storage station according to claim 9, wherein the electrochemical energy storage device group comprises:
a battery cluster or battery pack composed of one or more of metal ion batteries such as a lithium-ion battery, a sodium-ion battery, an aluminum-ion battery, a potassium-ion battery, and a magnesium-ion battery; or
a supercapacitor bank composed of one or two of metal-ion hybrid supercapacitors such as a lithium-ion hybrid supercapacitor and a potassium-ion hybrid supercapacitor.

11. The molecular probe-based safety prewarning and fault location system for an electrochemical energy storage station according to claim 5, wherein the camera is a visible light camera or a fluorescent camera, and the camera transmits the real-time image information of each molecular probe label to the host through wired communication or wireless communication.

12. A molecular probe-based safety prewarning and fault location system for an electrochemical energy storage station, comprising a molecular probe label, a camera, and a host, wherein
there are a plurality of molecular probe labels distributed in an electrochemical energy storage device group, and the molecular probe label is provided with a gas sensing region that can perform a specific reaction with a gas and generate a color change;
the camera is configured to capture real-time image information of each molecular probe label and transmit the real-time image information to the host; and
the host is configured to recognize an abnormal electrochemical energy storage device based on the real-time image information of the gas sensing region of the molecular probe label, and configured to recognize position information of the abnormal electrochemical energy storage device, and output an alarm signal and the position information of the abnormal electrochemical energy storage device;
wherein the camera is securely installed on a slide rail in a prefabricated cabin;
wherein the host is further configured to:
recognize the position information of the abnormal electrochemical energy storage device based on a position of the camera on the slide rail when the camera is facing the molecular probe label.

13. The molecular probe-based safety prewarning and fault location system for an electrochemical energy storage station according to claim 12, wherein the gas sensing region is provided with at least one specific reaction region, a surface of each specific reaction region is coated with a functional molecule that can perform a specific reaction with carbon monoxide or nitric oxide and generate a color change, and a time needed to generate the color change in the specific reaction is 1 second to 30 minutes.

14. The molecular probe-based safety prewarning and fault location system for an electrochemical energy storage station according to claim 12, wherein the molecular probe label is further provided with a position marker region for recording position information of an electrochemical energy storage device; and the host recognizes the position information of the abnormal electrochemical energy storage device based on an image of the position marker region.

15. The molecular probe-based safety prewarning and fault location system for an electrochemical energy storage station according to claim 14, wherein the position information, of the electrochemical energy storage device, recorded in the position marker region comprises a number of a specific prefabricated cabin of the electrochemical energy storage device in an energy storage station, a number of the electrochemical energy storage device group, and a number of the electrochemical energy storage device; and the position information is printed in the position marker region in a form of Chinese, English, a one-dimensional code, a two-dimensional code, or a digital number.

16. The molecular probe-based safety prewarning and fault location system for an electrochemical energy storage station according to claim 12, wherein the host is specifically configured to:
calculate a color change value of a surface of the gas sensing region of the molecular probe label by using one or more of an RGB color system, a YUV color system, and an HLS color system based on the real-time image information of the gas sensing region of the molecular probe label;

compare the color change value with a preset threshold, and recognize a molecular probe label whose color change value exceeds the preset threshold; and determine, as the abnormal electrochemical energy storage device, an electrochemical energy storage device in a region in which the molecular probe label whose color change value exceeds the preset threshold is located.

17. The molecular probe-based safety prewarning and fault location system for an electrochemical energy storage station according to claim 12, wherein the electrochemical energy storage device group is constituted by electrochemical energy storage devices using an organic electrolyte.

18. The molecular probe-based safety prewarning and fault location system for an electrochemical energy storage station according to claim 17, wherein the electrochemical energy storage device group comprises:

a battery cluster or battery pack composed of one or more of metal ion batteries such as a lithium-ion battery, a sodium-ion battery, an aluminum-ion battery, a potassium-ion battery, and a magnesium-ion battery; or a supercapacitor bank composed of one or two of metal-ion hybrid supercapacitors such as a lithium-ion hybrid supercapacitor and a potassium-ion hybrid supercapacitor.

19. The molecular probe-based safety prewarning and fault location system for an electrochemical energy storage station according to claim 12, wherein the camera is a visible light camera or a fluorescent camera, and the camera transmits the real-time image information of each molecular probe label to the host through wired communication or wireless communication.

* * * * *